(12) United States Patent
Yoshihara et al.

(10) Patent No.: US 8,453,599 B2
(45) Date of Patent: Jun. 4, 2013

(54) RESIST SOLUTION SUPPLY APPARATUS, RESIST SOLUTION SUPPLY METHOD, AND COMPUTER STORAGE MEDIUM

(75) Inventors: Kosuke Yoshihara, Koshi (JP); Yusuke Yamamoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 244 days.

(21) Appl. No.: 12/850,876

(22) Filed: Aug. 5, 2010

(65) Prior Publication Data
US 2011/0045195 A1    Feb. 24, 2011

(30) Foreign Application Priority Data
Aug. 20, 2009    (JP) ................................. 2009-190682

(51) Int. Cl.
*B05C 11/00* (2006.01)
*B05C 11/02* (2006.01)

(52) U.S. Cl.
USPC ............. 118/667; 118/712; 118/52; 118/612

(58) Field of Classification Search
USPC .................. 118/52, 612, 666, 667, 712, 713, 118/300, 319, 320; 427/240, 398.1, 421.1, 427/8; 396/604, 611, 627; 134/153, 198, 134/902; 700/123
See application file for complete search history.

(56) References Cited

U.S. PATENT DOCUMENTS
5,134,962 A * 8/1992 Amada et al. ................. 118/688
2003/0180471 A1* 9/2003 Takekuma et al. ............ 427/421
2005/0016449 A1* 1/2005 Chen et al. .................... 118/666
2006/0266286 A1* 11/2006 Kasuga ......................... 118/666
2008/0118629 A1* 5/2008 Shimoda et al. .................. 427/8

FOREIGN PATENT DOCUMENTS

| JP | A-H05-251329 | 9/1993 |
|---|---|---|
| JP | A-H05-267148 | 10/1993 |
| JP | A-H09-290201 | 11/1997 |
| JP | A-11-033459 | 2/1999 |
| JP | 2002-025887 A | 1/2002 |
| JP | A-2002-502055 | 1/2002 |
| JP | A-2005-173211 | 6/2005 |

OTHER PUBLICATIONS

English Translated doc JP 09-290201, Nov. 11, 1997.*
Office Action mailed Dec. 6, 2011 in corresponding JP Application No. 2009-190682 (and English translation).

* cited by examiner

Primary Examiner — Yewebdar Tadesse
(74) Attorney, Agent, or Firm — Posz Law Group, PLC (57) ABSTRACT

A resist solution supply apparatus of the present invention includes: a resist solution supply source storing a resist solution therein; a supply tube for supplying the resist solution from the resist solution supply source to a coating nozzle; a filter provided in the supply tube for removing foreign matter in the resist solution; and a heating unit provided along the supply tube at a position closer to the resist solution supply source than the filter, for heating the resist solution in the supply tube to a predetermined temperature higher than room temperature to make a resist gel to aggregate to become coarse so that the coarse resist gel can be collected and removed by the filter.

7 Claims, 10 Drawing Sheets

RESIST SOLUTION SUPPLY APPARATUS, RESIST SOLUTION SUPPLY METHOD, AND COMPUTER STORAGE MEDIUM

BACKGROUND OF THE INVENTION

1. Field of the Invention

The present invention relates to a resist solution supply apparatus, a resist solution supply method, and a computer storage medium each for supplying a resist solution to a coating nozzle for discharging the resist solution to a substrate, for example, a semiconductor wafer or the like.

2. Description of the Related Art

In a photolithography process in manufacturing processes of a semiconductor device, for example, a resist coating treatment of applying a resist solution onto, for example, a semiconductor wafer (hereinafter, referred to as a "wafer") to form a resist film is performed.

In the above-described resist coating treatment, for example, a method of discharging the resist solution from a coating nozzle onto the wafer and rotating the wafer to thereby diffuse the resist solution over the wafer front surface, that is, a so-called spin coating method is widely used. In this spin coating method, the temperature of the resist solution to be discharged onto the wafer needs to be regulated to a desired temperature, for example, room temperature in order to apply the resist solution in a uniform thickness on the wafer.

Hence, it has been conventionally proposed that a first temperature regulating unit is provided along a supply tube for supplying the resist solution to the coating nozzle near the coating nozzle (near an end portion of the supply tube) to regulate the temperature of the resist solution to room temperature. The first temperature regulating unit can regulate the temperature of the resist solution, for example, by passing a temperature regulating water through the first temperature regulating unit. Further, to efficiently perform the temperature regulation of the resist solution, a second temperature regulating unit for performing temperature regulation of the resist solution is further provided near the other end portion of the supply tube to supply the temperature regulating water used in the first temperature regulating unit to the second temperature regulating unit (Japanese Patent No. 3585217).

SUMMARY OF THE INVENTION

Incidentally, in the resist solution, gel-like insoluble matter (hereinafter, referred to as "resist gel") that is polymer-based compound in the resist solution aggregated with time may be generated. However, only by the temperature regulation of the resist solution to be supplied onto the wafer to room temperature as in the prior art, the resist solution could be applied on the wafer in a uniform thickness, but the resist gel could not be removed from the resist solution. Further, it is also conceivable to provide a filter in the supply tube, but it is technically difficult to completely remove the resist gel by the existing filter because the resist gel is minute.

If the resist solution is supplied onto the wafer without removing the resist gel as described above, the resist gel remains in the resist film which will be formed thereafter to cause defects of the resist pattern to be formed in the resist film. Especially with miniaturization of semiconductor devices in recent years, defects due to the resist gel are prominently caused.

The present invention has been made in view of the above points, and an object thereof is to reduce foreign matter in a resist solution to be supplied onto a substrate to thereby reduce defects of a resist pattern.

To achieve the above object, the present invention is a resist solution supply apparatus for supplying a resist solution which has been temperature-regulated by a temperature regulator to a coating nozzle for discharging the resist solution to a substrate, the apparatus including: a resist solution supply source storing the resist solution therein; a supply tube for supplying the resist solution from the resist solution supply source to the coating nozzle; a filter provided in the supply tube for removing foreign matter in the resist solution; and a heating unit provided along the supply tube on a side closer to the resist solution supply source than the filter, separately from the temperature regulator, for heating the resist solution in the supply tube to a predetermined temperature higher than room temperature.

From the study by the inventors, it was found that the resist gel occurring in the resist solution containing, for example, a fluorine-based resin when heated at a temperature higher than room temperature further aggregates and units to become coarse. In the resist solution supply apparatus of the present invention, the heating unit is provided along the supply tube on a side closer to the resist solution supply source than the filter, so that the heating unit can be used to heat the resist solution to the predetermined temperature higher than room temperature, thereby making the resist gel to aggregate to becomes coarse. Thereafter, the coarse resist gel can be collected and removed by the filter. Accordingly, the resist gel in the resist solution to be supplied to the substrate can be reduced, whereby the defects of the resist pattern to be formed on the substrate by the resist solution can be reduced.

Note that room temperature is, for example, 23° C. Accordingly, it is only necessary that the predetermined temperature of the resist solution heated by the heating unit is a temperature higher than 23° C. Further, to prevent quality deterioration of the resist solution, it is desirable that the resist solution is heated to 50° C. or lower.

The present invention according to another aspect is a resist solution supply method of supplying a resist solution to a coating nozzle for discharging the resist solution to a substrate, including: a heating step of heating the resist solution up to a predetermined temperature higher than room temperature; then, a removing step of removing foreign matter in the resist solution using a filter; and then, a supplying step of supplying the resist solution to the coating nozzle.

The present invention according to still another aspect is a computer-readable storage medium storing a program running on a computer of a control unit for controlling a resist solution supply apparatus to cause the resist solution supply apparatus to execute the above-described resist solution supply method.

DETAILED DESCRIPTION OF THE INVENTION

Figure 1:
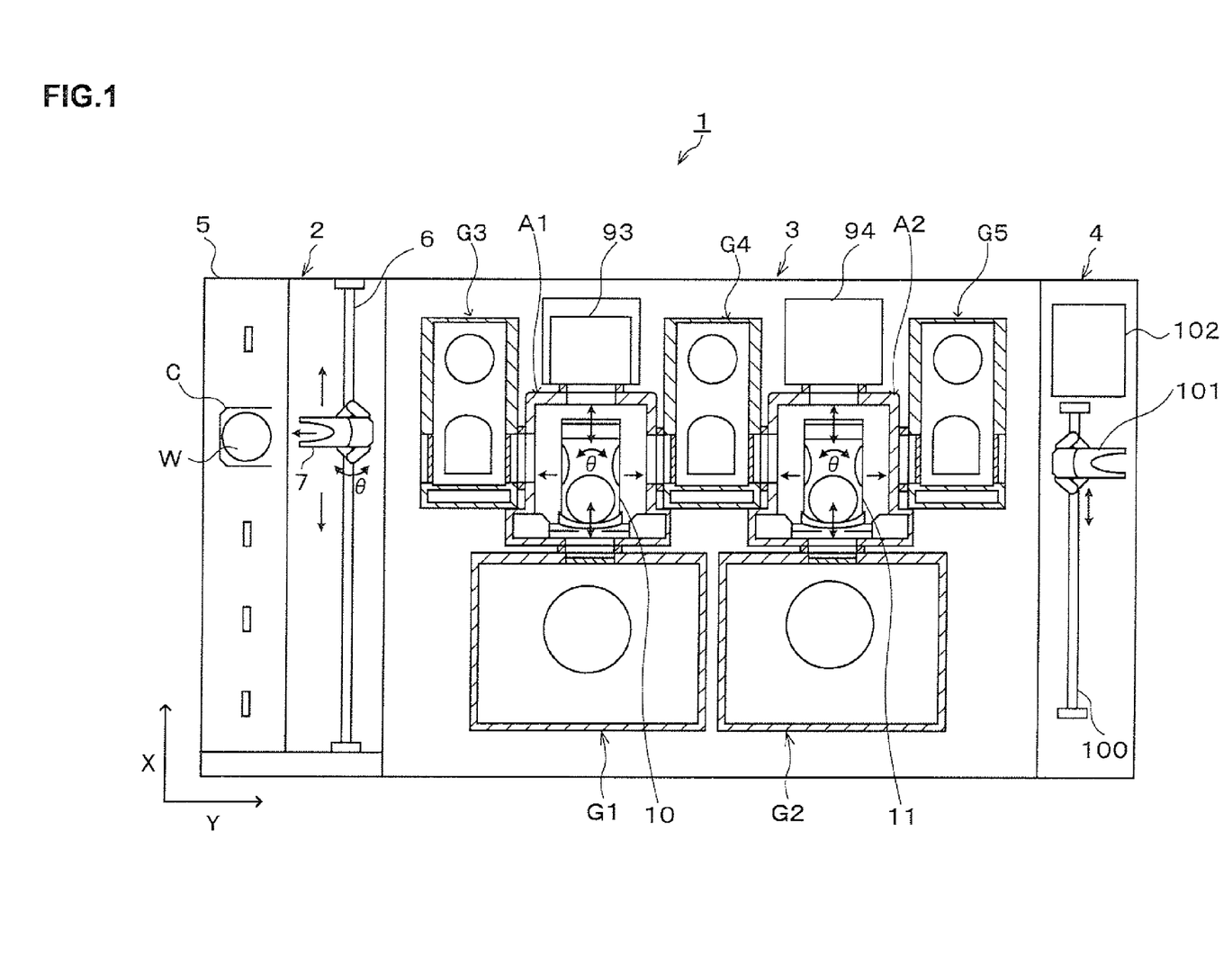
FIG. 1 is a plan view schematically showing a configuration of a coating and developing treatment system including a resist solution supply apparatus according to this embodiment.
Figure 2:
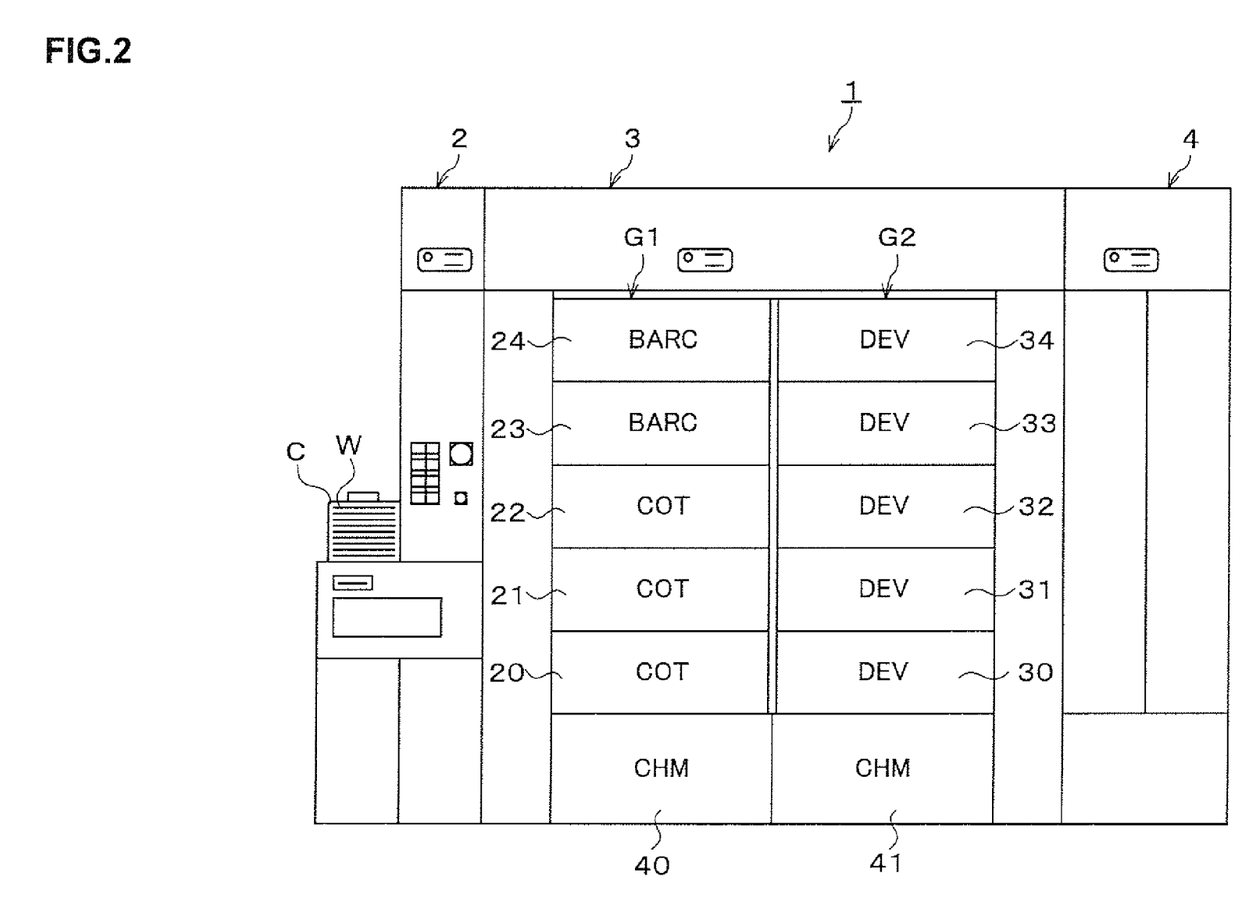
FIG. 2 is a front view schematically showing the coating and developing treatment system according to this embodiment.
Figure 3:
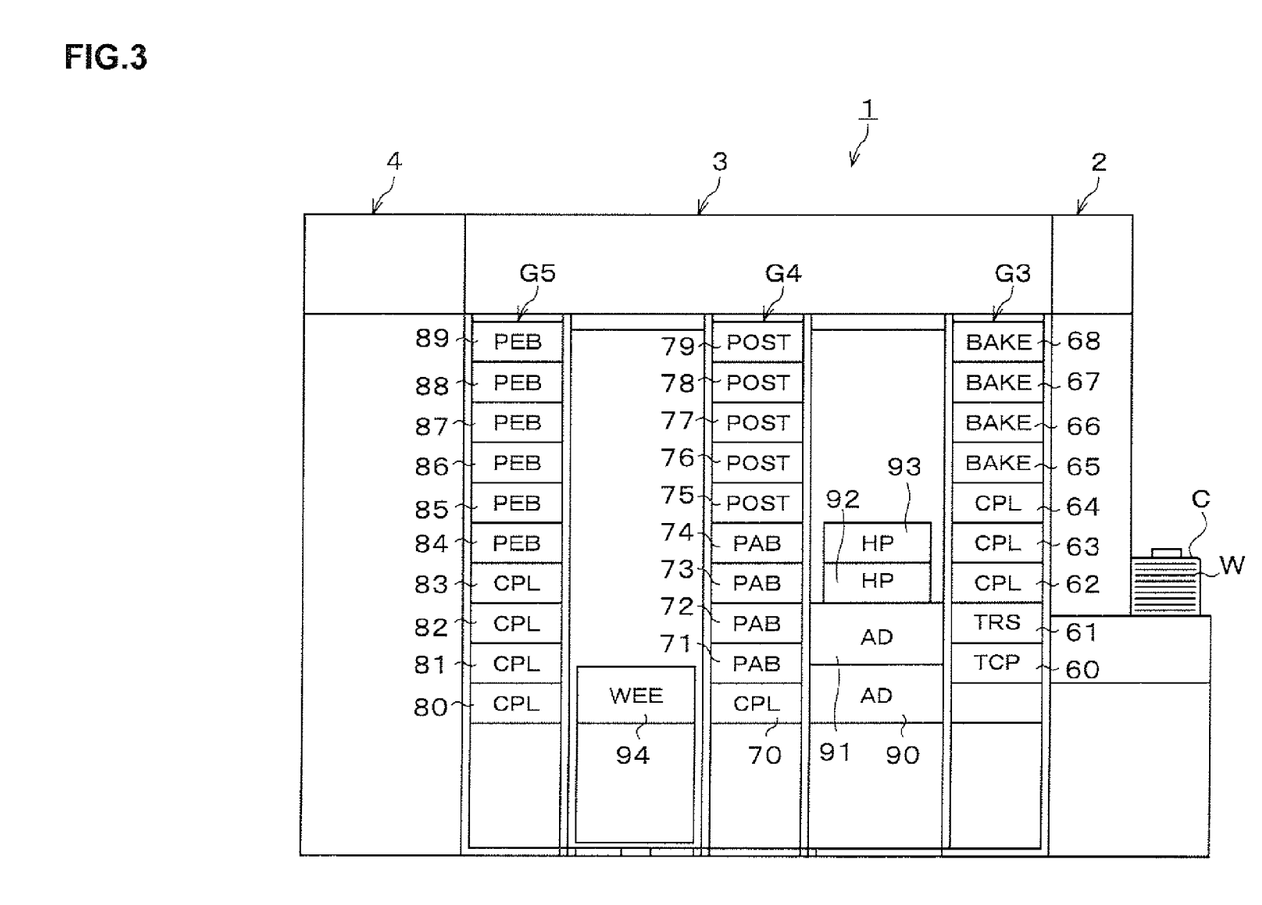
FIG. 3 is a rear view schematically showing the coating and developing treatment system according to this embodiment.

Hereinafter, a preferred embodiment of the present invention will be described. FIG. 1 is a plan view schematically showing a configuration of a coating and developing treatment system 1 including a resist solution supply apparatus according to this embodiment. FIG. 2 is a front view schematically showing the configuration of the coating and developing treatment system 1, and FIG. 3 is a rear view schematically showing the configuration of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, for performing predetermined processing or treatment in a manner of single wafer processing in a photolithography process; and an interface station 4 for passing the wafer W to/from an aligner (not shown) provided adjacent to the processing station 3, are integrally connected.

In the cassette station 2, a cassette mounting table 5 is provided and configured such that a plurality of cassettes C can be mounted on the cassette mounting table 5 in a line in an X-direction (a top-to-bottom direction in FIG. 1). In the cassette station 2, a wafer transfer body 7 is provided which is movable in the X-direction on a transfer path 6. The wafer transfer body 7 is also movable in a wafer-arrangement direction of the wafers W housed in the cassette C (a Z-direction; the vertical direction), and thus can selectively access the wafers W in each of the cassettes C arranged in the X-direction.

The wafer transfer body 7 is rotatable in a θ-direction around the Z-axis, and can access a temperature regulating unit 60 and a transition unit 61 for passing the wafer W which are included in a later-described third processing unit group G3 on the processing station 3 side.

The processing station 3 adjacent to the cassette station 2 includes, for example, five processing unit groups G1 to G5 in each of which a plurality of processing and treatment units are multi-tiered. On an X-direction negative direction (downward direction in FIG. 1) side in the processing station 3, the first processing unit group G1 and the second processing unit group G2 are placed in order from the cassette station 2 side. On an X-direction positive direction (upward direction in FIG. 1) side in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit A1 is provided, and a first transfer arm 10 for supporting and transferring the wafer W is provided in the first transfer unit A1. The first transfer arm 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit A2 is provided, and a second transfer arm 11 for supporting and transferring the wafer W is provided in the second transfer unit A2. The second transfer arm 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 each for supplying various kinds of treatment solutions to the solution treatment units in the processing unit groups G1 and G2 are provided on the lowermost tiers of the first processing unit group G1 and the second processing unit group G2, respectively. Note that the resist solution in this embodiment contains a fluorine-based resin.

As shown in FIG. 3, in the third processing unit group G3, the temperature regulating unit 60, the transition unit 61, high-precision temperature regulating units 62 to 64 each for temperature-regulating the wafer W under temperature control with a high precision, and high-temperature thermal processing units 65 to 68 each for performing heat processing on the wafer W at a high temperature are nine-tiered in order from the bottom.

In the fourth processing unit group G4, for example, a high-precision temperature regulating unit 70, pre-baking units 71 to 74 each for performing heat processing on the wafer W after the resist coating treatment, and post-baking units 75 to 79 each for performing heat processing on the wafer W after the developing treatment, are ten-tiered in order from the bottom.

In the fifth processing unit group G5, a plurality of thermal processing units each for performing thermal processing on the wafer W, for example, high-precision temperature regulating units 80 to 83 and post-exposure baking units 84 to 89 are ten-tiered in order from the bottom.

As shown in FIG. 1, a plurality of processing and treatment units are arranged on the X-direction positive direction side of the first transfer unit A1, adhesion units 90 and 91 each for performing hydrophobic treatment on the wafer W and heating units 92 and 93 each for heating the wafer W being four-tiered in order from the bottom as shown in FIG. 3. As shown in FIG. 1, on the X-direction positive direction side of the second transfer unit A2, for example, an edge exposure unit 94 is disposed which selectively exposes only the edge portion of the wafer W to light.

In the interface station 4, a wafer transfer body 101 moving on a transfer path 100 extending in the X-direction and a buffer cassette 102 are provided as shown in FIG. 1. The wafer transfer body 101 is movable in the Z-direction and also rotatable in the θ-direction and thus can access the aligner (not shown) adjacent to the interface station 4, the buffer cassette 102, and the fifth processing unit group G5 and transfer the wafer W to them.

Figure 4:
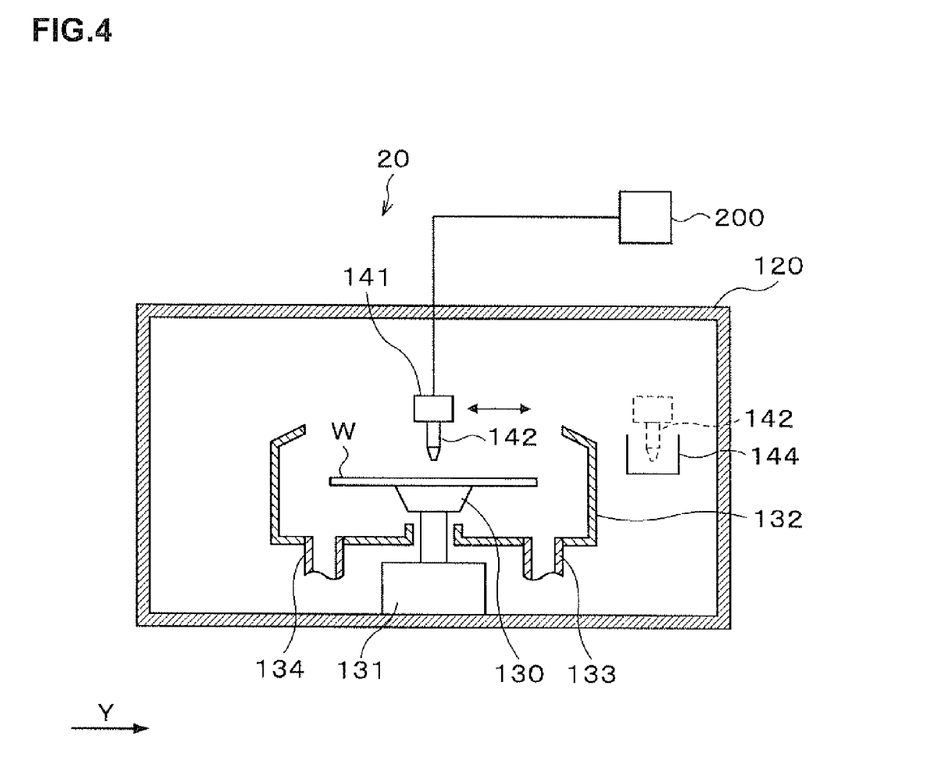
FIG. 4 is a longitudinal sectional view schematically showing a configuration of a resist coating unit.
Figure 5:
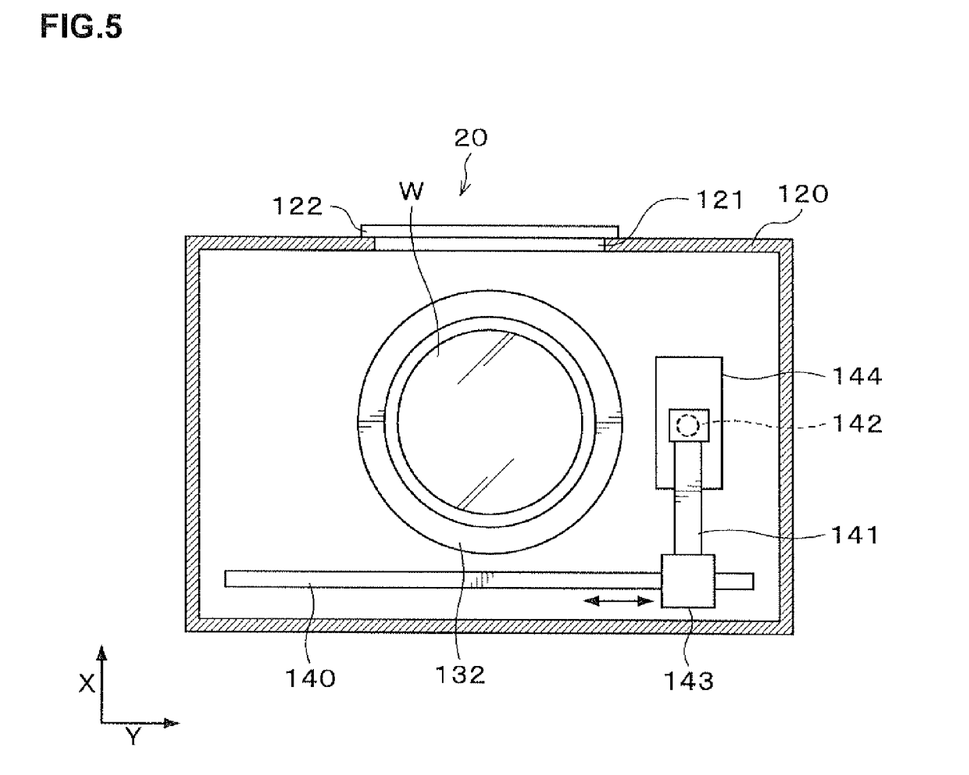
FIG. 5 is a transverse sectional view schematically showing the configuration of the resist coating unit.

Next, the configurations of the above-described resist coating units 20 to 22 will be described. FIG. 4 is a longitudinal section view schematically showing the configuration of the resist coating unit 20, and FIG. 5 is a transverse sectional view schematically showing the configuration of the resist coating unit 20.

The resist coating unit 20 has a treatment container 120 whose inside can be closed as shown in FIG. 4. A side surface of the treatment container 120 facing a transfer-in region for the first transfer arm 10 is formed with a transfer-in/out port 121 for the wafer W as shown in FIG. 5, and an opening/closing shutter 122 is provided at the transfer-in/out port 121.

At a central portion in the treatment container 120, a spin chuck 130 for holding and rotating the wafer W is provided as shown in FIG. 4. The spin chuck 130 has a horizontal upper surface, and the upper surface is provided with, for example, a suction port (not shown) through which the wafer W is sucked. The suction through the suction port allows the wafer W to be held on the spin chuck 130.

The spin chuck 130 has a chuck drive mechanism 131 equipped with, for example, a motor or the like and can rotate at a predetermined speed by means of the chuck drive mechanism 131. Further, the chuck drive mechanism 131 is provided with a raising and lowering drive source such as a cylinder so that the spin chuck 130 can move up and down.

Around the spin chuck 130, a cup 132 is provided which receives and collects liquid splashing or dropping from the wafer W. A drain pipe 133 for draining the collected liquid and an exhaust tube 134 for exhausting the atmosphere in the cup 132 are connected to the bottom surface of the cup 132.

As shown in FIG. 5, on an X-direction negative direction (downward direction in FIG. 5) side of the cup 132, a rail 140 is formed which extends in a Y-direction (right-to-left direction in FIG. 5). The rail 140 is formed, for example, from a Y-direction negative direction (left direction in FIG. 5) side outer position of the of the cup 132 to a Y-direction positive direction (right direction in FIG. 5) side outer position. To the rail 140, an arm 141 is attached.

On the arm 141, a coating nozzle 142 for discharging the resist solution is supported as shown in FIG. 4 and FIG. 5. The arm 141 is movable on the rail 140 by means of a nozzle drive unit 143 shown in FIG. 5. This allows the coating nozzle 142 to move from a waiting section 144 provided at the Y-direction positive direction side outer position of the cup 132 to a position above a central portion of the wafer W in the cup 132 and further move in a direction of the diameter of the wafer W above the front surface of the wafer W. Further, the arm 141 can freely move up and down by means of the nozzle drive unit 143 to be able to adjust the height of the coating nozzle 142. The coating nozzle 142 is connected to a resist solution supply apparatus 200 for supplying the resist solution as shown in FIG. 4.

Note that the configurations of the resist coating units 21 and 22 are the same as that of the above-described resist coating unit 21, and therefore description will be omitted.

Figure 6:
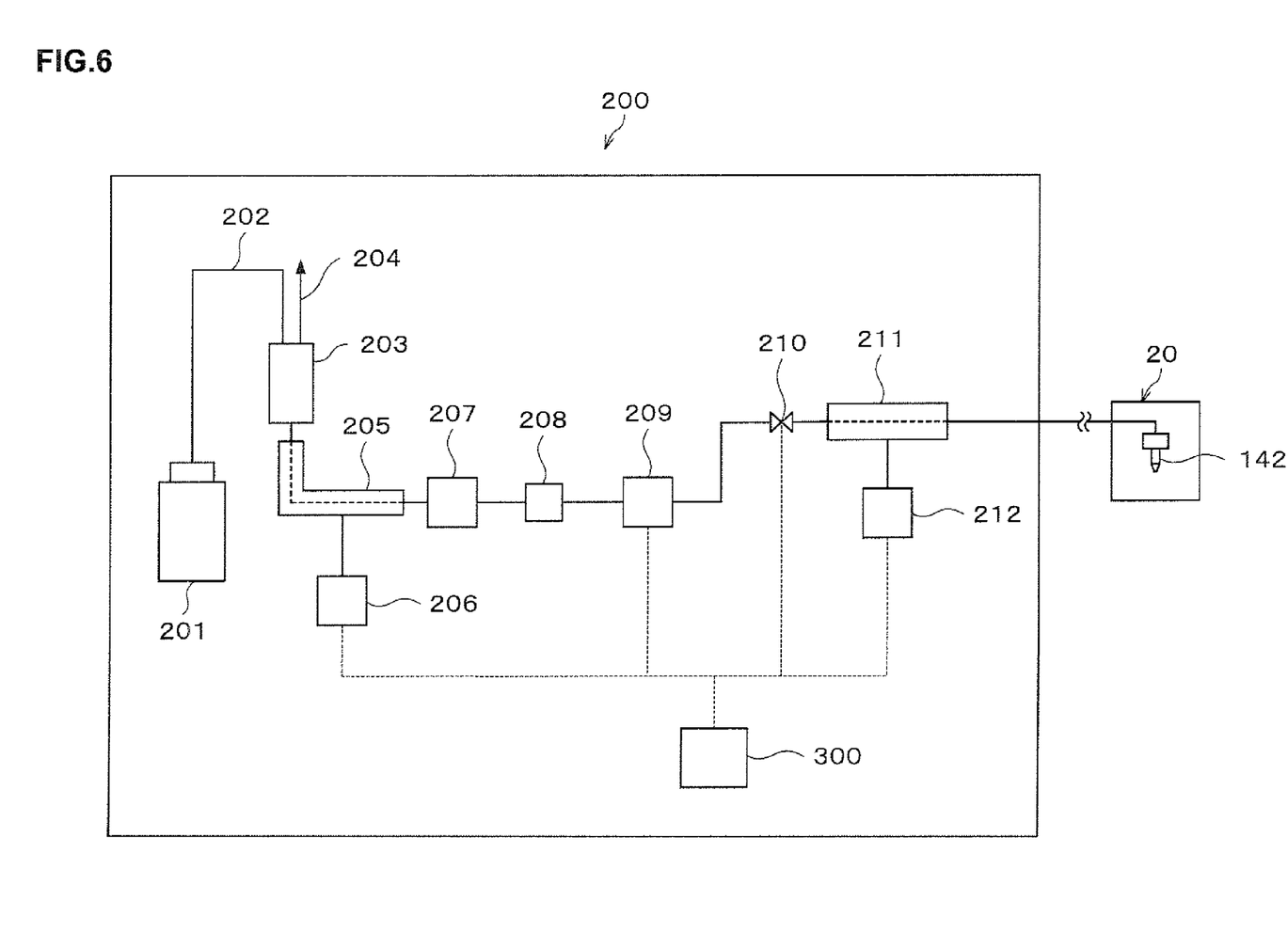
FIG. 6 is an explanatory view schematically showing a configuration of the resist solution supply apparatus.

Next, a configuration of the resist solution supply apparatus 200 for supplying the resist solution to the coating nozzle 142 in the resist coating unit 20 will be described. FIG. 6 is an explanatory view schematically showing the configuration of the resist solution supply apparatus 200. Note that the resist solution supply apparatus 200 is provided, for example, in the chemical chamber 40 shown in FIG. 2.

The resist solution supply apparatus 200 has a resist solution supply source 201 storing the resist solution therein. The resist solution is stored at room temperature, for example, 23° C. in the resist solution supply source 201. At an upper portion of the resist solution supply source 201, a supply tube 202 for supplying the resist solution to the coating nozzle 142 is provided. In other words, the supply tube 202 is provided in a manner to connect the resist solution supply source 201 and the coating nozzle 142.

The supply tube 202 downstream from the resist solution supply source 201 is provided with a liquid end tank 203 for temporarily storing the resist solution. At an upper portion of the liquid end tank 203, an auxiliary tube 204 for exhausting the atmosphere in the liquid end tank 203 is provided. The liquid end tank 203 serves as a buffer tank so that even when the resist solution to be supplied from the resist solution supply source 201 runs out, the resist solution stored in the liquid end tank 203 can be supplied to the coating nozzle 142.

Figure 7:
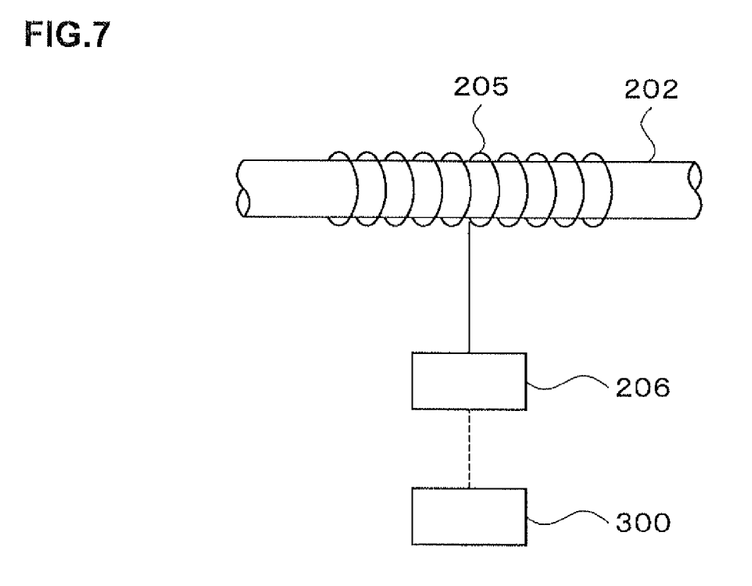
FIG. 7 is an explanatory view schematically showing a configuration of a heater and a temperature regulator.

The supply tube 202 downstream from the liquid end tank 203 is provided with a heater 205 as a heating unit for heating the resist solution in the supply tube 202. The heater 205 is spirally wound around the outer periphery of the supply tube 202 as shown in FIG. 7. The heater 205 is provided with a temperature regulator 206 for controlling the heating temperature of the heater 205. Setting of the heating temperature of the heater 205 by the temperature regulator 206 is controlled by a later-described control unit 300.

The heating temperature by the heater 205 is set by the temperature regulator 206 to a temperature higher than 23° C. that is room temperature, more preferably, 30° C. or higher. By setting the heating temperature to the temperature higher than room temperature as described above, the resist solution in the supply tube 202 is heated to a temperature higher than room temperature, thereby allowing a resist gel in the resist solution to aggregate. Further, the heating temperature by the heater 205 is set to 50° C. or lower. By setting the heating temperature to 50° C. or lower as described above, the resist solution never deteriorates in quality. By the heater 205 whose heating temperature is set as described above, the resist solution in the supply tube 202 is heated to a predetermined temperature ranging from the temperature higher than 23° C. to 50° C. Note that the heating temperature of the heater 205 is set at 50° C. in this embodiment.

The supply tube 202 downstream from the heater 205 is provided with a filter 207 for collecting and removing foreign matter in the resist solution, for example, resist gel and so on as shown in FIG. 6. The supply tube 202 downstream from the filter 207 is provided with a trap 208 for trapping foreign matter in the resist solution. The trap 208 is provided for the purpose of assisting the filter 207.

The supply tube 202 downstream from the trap 208 is provided with a pump 209 for pressure-feeding the resist solution from the resist solution supply source 201 to the coating nozzle 142. For the pump 209, for example, a tubephragm-type pump is used. The operation of the pump 209 is controlled, for example, by the later-described control unit 300.

The supply tube 202 downstream from the pump 209 is provided with a valve 210. For the valve 210, for example, an air-operation valve is used. The opening/closing operation of the valve 210 is controlled by control of the later-described control unit 300 such that the supply of the resist solution from the pump 209 to the coating nozzle 142 can be started or stopped.

Figure 8:
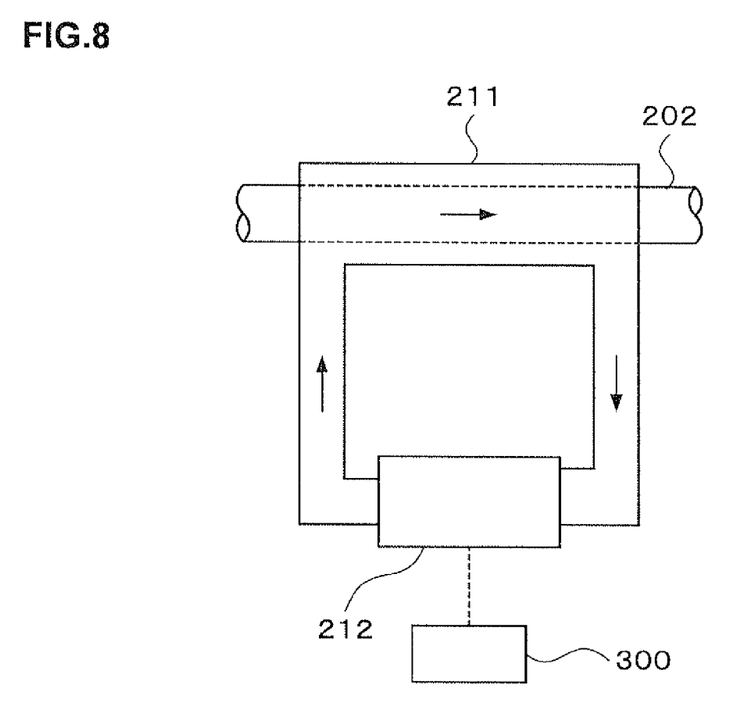
FIG. 8 is an explanatory view schematically showing a configuration of temperature regulating piping and a temperature regulator.

The supply tube 202 downstream from the valve 210 is provided with temperature regulating piping 211 as a cooling unit for cooling the resist solution in the supply tube 202. The temperature regulating piping 211 is provided to surround the outer periphery of the supply tube 202 as shown in FIG. 8. Inside the temperature regulating piping 211, temperature regulating water flows and, for example, pure water is used for the temperature regulating water. The temperature regulating piping 211 is connected to a temperature regulator 212 for regulating the temperature of the temperature regulating water. The temperature setting of the temperature regulating water in the temperature regulating piping 211 by the temperature regulator 212 is controlled by the later-described control unit 300.

The cooling temperature by the temperature regulating water in the temperature regulating piping 211 is set to cool the resist solution in the supply tube 202 to 23° C. that is room temperature. Then, the temperature regulating water in the temperature regulating piping 211 regulates the temperature of the resist solution to 23° C. via the supply tube 202, and is then sent to the temperature regulator 212 and temperature-regulated and used again for temperature regulation of the resist solution in the supply tube 202.

The setting of the heating temperature of the heater 205 by the temperature regulator 206, the drive operation of the pump 209, the opening/closing operation of the valve 210, and the temperature setting of the temperature regulating water in the temperature regulating piping 211 by the temperature regulator 212 which are described above are controlled by the control unit 300. The control unit 300 is composed of a computer equipped with, for example, a CPU and a memory, and can realize the supply of the resist solution by the resist solution supply apparatus 200 and the resist coating treatment in the resist coating unit 20 by executing programs, for example, stored in the memory. Note that various programs used for realizing the supply of the resist solution by the resist solution supply apparatus 200 and the resist coating treatment in the resist coating unit 20 are ones that are stored, for example, in a computer-readable storage medium (not shown) such as a hard disk (HD), a flexible disk (FD), a compact disk (CD), a magneto-optical disk (MO), or a memory card, and installed from the storage medium into the control unit 300.

Next, the supply of the resist solution to the coating nozzle 142 performed in the resist solution supply apparatus 200 configured as described and the coating treatment process performed in the resist coating unit 20 will be described together with the process of the wafer processing performed in the whole coating and developing treatment system 1.

First of all, one wafer W is taken out of the cassette C on the cassette mounting table 5 by the wafer body 7 and transferred to the temperature regulating unit 60 in the third processing unit group G3. The wafer W transferred to the temperature regulating unit 60 is temperature-regulated to a predetermined temperature, and then transferred by the first transfer arm 10 to the bottom coating unit 23, where an anti-reflection film is formed. The wafer W on which the anti-reflection film has been formed is transferred by the first transfer arm 10 to the heating unit 92, the high-temperature thermal processing unit 65 and the high-precision temperature regulating unit 70 in sequence, and subjected to predetermined processing in each of the units. The wafer W is then transferred to the resist coating unit 20. Note that the coating treatment of the resist solution in the resist coating unit 20 will be described later.

After the resist film is formed on the wafer W in the resist coating unit 20, the wafer W is transferred by the first transfer arm 10 to the pre-baking unit 71 and subjected to heat processing. Subsequently, the wafer W is transferred by the second transfer arm 11 to the edge exposure unit 94 and the high-precision temperature regulating unit 83 in sequence to be subjected to predetermined processing in each of the units. The wafer W is then transferred by the wafer transfer body 101 in the interface station 4 to the aligner (not shown) where a predetermined pattern is exposed on the resist film on the wafer W. The wafer W for which the exposure processing has been completed is transferred by the wafer transfer body 101 to the post-exposure baking unit 84 and subjected to predetermined processing.

After the thermal processing in the post-exposure baking unit 84 is completed, the wafer W is transferred by the second transfer arm 11 to the high-precision temperature regulating unit 81 and temperature-regulated, and then transferred to the developing treatment unit 30 where developing treatment is performed on the wafer W, whereby a pattern is formed in the resist film. The wafer W is then transferred by the second transfer arm 11 to the post-baking unit 75 and subjected to heat-processing, and then transferred to the high-precision temperature regulating unit 63 and temperature-regulated. The wafer W is transferred by the first transfer arm 10 to the transition unit 61 and then returned by the wafer transfer body 7 to the cassette C, with which a series of photolithography process ends.

Next, a series of resist coating treatment of supplying the resist solution from the resist solution supply apparatus 200 to the coating nozzle 142 in the resist coating unit 20 and applying the resist solution to the wafer W in the resist coating unit 20 will be described.

First, the valve 210 is opened and the pump 209 is operated by the control unit 300. Then, the resist solution is pressure-fed from the resist solution supply source 201 to the liquid end tank 203. The resist solution is temporarily stored in the liquid end tank 203. Once a predetermined amount of resist solution is stored in the liquid end tank 203, the resist solution subsequently flowing from the resist solution supply source 201 into the liquid end tank 203 causes the resist solution stored in the liquid end tank 203 to flow out of the liquid end tank 203 toward the coating nozzle 142.

After the resist solution starts to flow out of the liquid end tank 203, the heater 205 is operated to heat up to 50° C., and the temperature regulating water which has been temperature-regulated to a predetermined temperature is also caused to flow through the temperature regulating piping 211. Note that the wafer W is transferred into the resist coating unit 20 at this moment.

The resist solution flows out of the liquid end tank 203 then flows through the supply tube 202 provided with the heater 205. In this event, the resist solution is heated by the heater 205 at the predetermined temperature ranging from the temperature higher than 23° C. to 50° C. This makes the resist gel in the resist solution aggregate and unite to become coarse. The resist solution then passes through the filter 207 so that the coarse resist gel is collected and removed. Further, by the filter 207, foreign matter in the resist solution other than the resist gel is also collected.

The resist solution then flows through the trap 208, the pump 209 and the valve 210 to the supply tube 202 provided with the temperature regulating piping 211. In this event, the resist solution is cooled down to 23° C. by the temperature regulating water in the temperature regulating piping 211. The resist solution cooled down to 23° C. in this manner is supplied to the coating nozzle 142.

When the resist solution is supplied to the coating nozzle 142, the wafer W held on the spin chuck 130 by suction is rotated by the chuck drive mechanism 131 in the resist coating unit 20, and the resist solution is dripped from the coating nozzle 142 onto a central portion of the wafer W. The resist solution applied to the wafer W diffuses over the entire front surface of the wafer W by the centrifugal force generated by the rotation of the wafer W, whereby a resist film is formed on the front surface of the wafer W. Thereafter, the rotation of the wafer W is sopped, and the wafer W is transferred out from the top of the spin chuck 130, with which a series of the resist coating treatment ends.

According to the above embodiment, the resist solution in the supply tube 202 can be heated by the heater 205 to the predetermined temperature higher than 23° C., thereby making the resist gel in the resist solution aggregate to become coarse. Thereafter, the filter 207 provided downstream from the heater 205 can collect the coarse resist gel to thereby remove the resist gel from the resist solution. This can reduce the resist gel in the resist solution to be discharged from the coating nozzle 142 onto the wafer W. Accordingly, defects of the resist pattern formed on the wafer W by the resist solution can be reduced so that the yields of the wafer W as a product can be improved.

The reason why the resist gel in the resist solution aggregates to become coarse at a temperature higher than room temperature as described above is that the resist solution contains, for example, a fluorine-based resin. This is the finding that was first obtained from the earnest study by the inventors. Just for information, in the case where the resist solution contains, for example, an acryl-based resin, when the resist solution is heated at a temperature higher than room temperature, the resist gel dissolves in the resist solution.

According to the above embodiment, the resist solution can be heated once to the predetermined temperature by the heater 205 and thereafter can be cooled down to 23° C. by the temperature regulating water in the temperature regulating piping 211. Accordingly, the resist solution temperature-regulated at 23° C. can be discharged from the coating nozzle 142 onto the wafer W, so that the thickness of the resist film to be formed on the wafer W can be made uniform.

Figure 9:
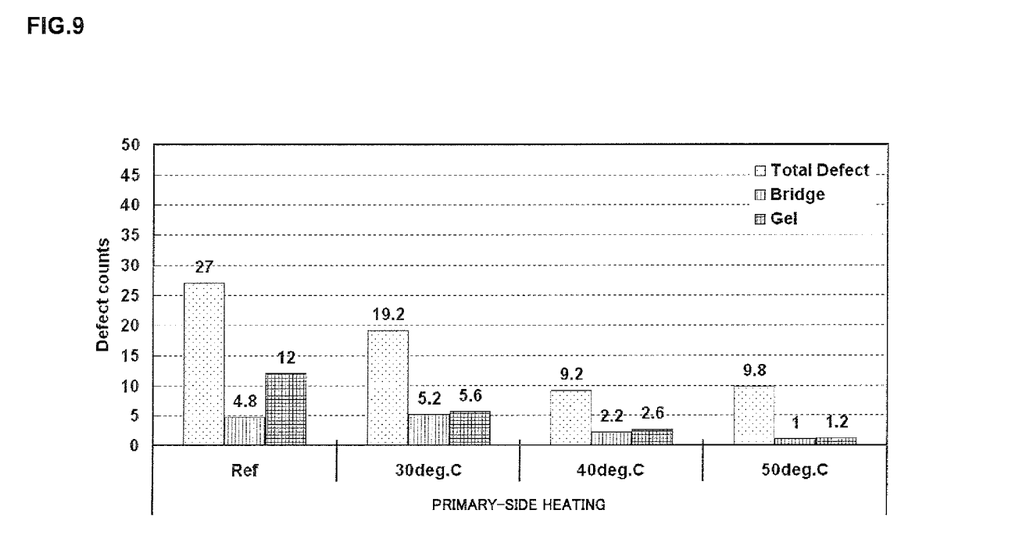
FIG. 9 is an explanatory view showing comparison between defects of a resist pattern occurring when a resist solution is supplied by a conventional method and defects of a resist pattern occurring when the resist solution is supplied by a method according to this embodiment.

Here, results of verification conducted by the inventors about the effect of reducing the above-described defects of the resist pattern are shown in FIG. 9. FIG. 9 shows the number of defects of the resist pattern when a series of photolithography processing was performed on the wafers W using the coating and developing treatment system 1 to form predetermined resist patterns on the wafers W. This verification was carried out under four conditions with the heating temperature of the resist solution by the heater 205 varied in the resist solution supply apparatus 200. More specifically, as a comparative example, the resist solution temperature-regulated at 23° C. by the conventional method without performing the heating of the resist solution by the heater 205 was supplied to the coating nozzle 142 (Ref in FIG. 9). Further, the resist solution heated and then cooled down to 23° C. was supplied to the coating nozzle 142 using the method according to this embodiment. In this event, the verification was carried out with the heating temperature of the heater 205 varied to 30° C., 40° C., and 50° C.

Figure 10:
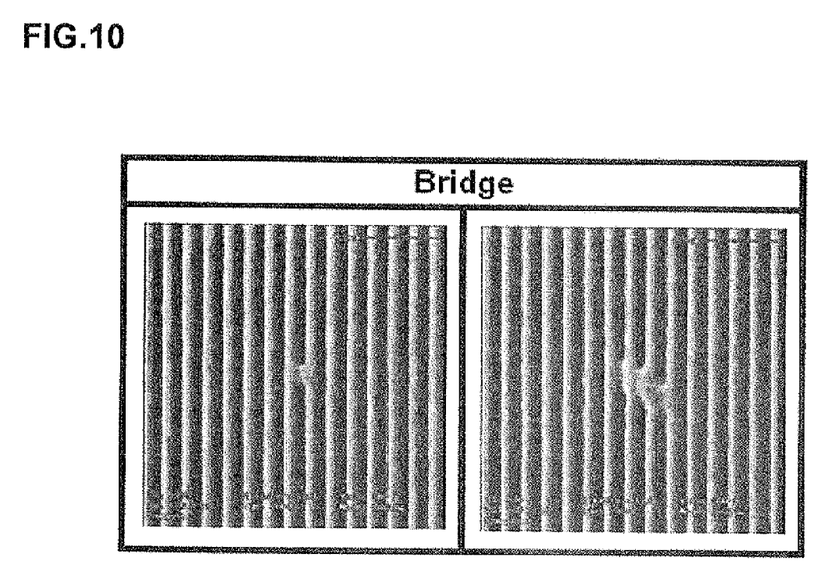
FIG. 10 is an explanatory view showing an example of bridge-based defect.
Figure 11:
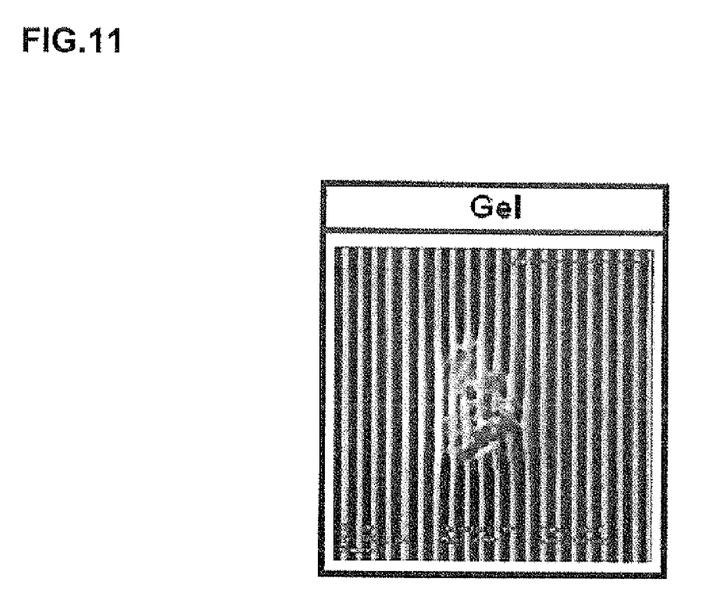
FIG. 11 is an explanatory view showing an example of gel-based defect.

Note that as the number of defects of the resist pattern, the total number of defects of the resist pattern (Total Defect in FIG. 9), the number of bridge-based defects (Bridge in FIG. 9), and the number of gel-based defects (Gel in FIG. 9) were counted. The bridge-based defect means a defect that is formed between the resist patterns on the wafer W as shown in FIG. 10. The gel-based defect means a defect that is formed in a large range on the resist pattern as shown in FIG. 11. The bridge-based defect and the gel-based defect are mainly caused by the resist gel in the resist solution discharged on the wafer W. More specifically, the bridge-based defect occurs when the resist gel aggregates to a lesser extent, whereas the gel-based defect occurs when the resist gel aggregates to some extent. Incidentally, the total number of defects of the resist pattern includes the number of defects caused, for example, from foreign matter other than the resist gel as well as the numbers of the bridge-based defects and gel-based defects.

Referring to FIG. 9, it was found that the number of defects of the resist pattern decreases when the resist solution is heated as compared to the case where the resist solution is not heated. In other words, it was found that when the resist solution is supplied to the coating nozzle using the method according to this embodiment, the number of defects of the resist pattern becomes smaller than in the prior art. It was found that especially when the heating temperature of the heater 205 is set to 50° C., the total number of defects of the resist pattern decreases by about 63%, the number of bridge-based defects decreases by about 79% and the number of gel-based defects decreases by about 90% as compared to the case where the resist solution is not heated.

Figure 12:
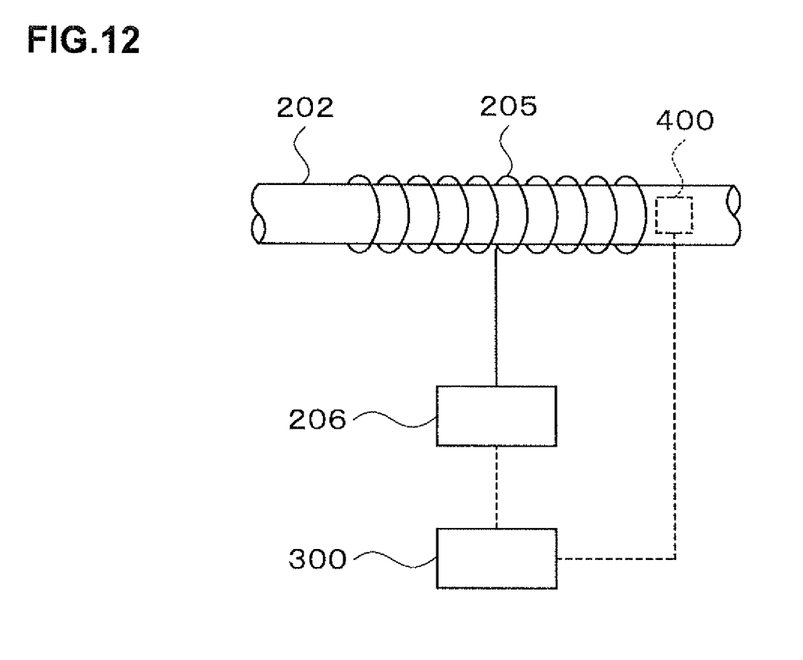
FIG. 12 is an explanatory view schematically showing a configuration of a heater and a temperature regulator according to another embodiment.

In the supply tube 202 provided with the heater 205 in the above embodiment, a temperature sensor 400 for measuring the temperature of the resist solution heated by the heater 205 may be provided as shown in FIG. 12. In this case, the temperature sensor 400 is provided near an end portion on the downstream from the heater 205. The measurement result measured by the temperature sensor 400 is then outputted to the control unit 300. The control unit 300 monitors the temperature measurement result of the heated resist solution and can control the setting of the heating temperature of the heater 205 in the temperature regulator 206 based on the measurement result. Thus, the resist solution can be heated at a fixed temperature at all times.

Though the heater 205 is used as the heating unit in the embodiment, temperature regulating piping (not show) through which a temperature regulating water flows may be used as the heating unit. In this case, a temperature regulator (not shown) is connected to the temperature regulating piping so that the temperature of the temperature regulating water is regulated by the temperature regulator. Then, the temperature regulating water heated to a predetermined temperature is caused to flow through the temperature regulating piping, whereby the resist solution in the supply tube 202 can be heated to the predetermined temperature. Note that the configurations of the temperature regulating piping and the temperature regulator are the same as those of the temperature regulating piping 211 as the above-described cooling unit and the temperature regulator 212.

Though the heater 205 is used as the heating unit in the above embodiment, a microwave irradiation device (not show) applying microwave to the supply tube 202 may be used. In this case, the microwave irradiation device is connected to the control unit 300 so that the wavelength, the irradiation time and so on of the microwave applied from the microwave irradiation device are controlled by the control unit 300. Then, by applying a predetermined microwave from the microwave irradiation device to the supply tube 202, the resist solution in the supply tube 202 can be heated to the predetermined temperature.

Though the resist solution in the supply tube 202 is cooled to 23° C. by the temperature regulating piping 211 in the above embodiment, the resist solution may be cooled to a temperature higher than 23° C., for example, 28° C. In this case, the resist solution at 28° C. is discharged from the coating nozzle 142 to the wafer W. Thus, in subsequently forming a resist film in the resist coating unit 20 by rotating the wafer W and diffusing the resist solution, the drying time of the resist film can be reduced. This can improve the throughout of the wafer processing.

A preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention. The present invention is not limited to the embodiment but can take various forms. The present invention is also applicable to the case where the substrate is a substrate other than the wafer, such as an FPD (Flat Panel Display), a mask reticle for a photomask, or the like.

The present invention is useful in supplying a resist solution to a coating nozzle for discharging the resist solution to a substrate, for example, a semiconductor wafer or the like.

What is claimed is:

1. A resist solution supply apparatus for supplying a resist solution to a coating nozzle for discharging the resist solution to a substrate, said apparatus comprising:
    a resist solution supply source storing the resist solution containing a fluorine-based resin therein;
    a supply tube for supplying the resist solution from said resist solution supply source to said coating nozzle;
    a tank provided at a position in the supply tube between said resist solution supply source and said coating nozzle for storing the resist solution supplied from the resist solution supply source;
    a filter provided in said supply tube between said tank and said coating nozzle for removing foreign matter in the resist solution;
    a heating unit provided in the supply tube between the filter and the tank for heating the resist solution in said supply tube to a predetermined temperature higher than a room temperature at which a resist gel in said resist solution starts to aggregate;
    a cooling unit provided along said supply tube between said filter and said coating nozzle for cooling the resist solution in said supply tube down to the room temperature;
    a trap provided in the supply tube between the filter and the cooling unit for trapping foreign matter in the resist solution;
    pump provided in the supply tube between the trap and the cooling unit for pressure-feeding the resist solution from the resist solution supply source to the coating nozzle;
    a temperature sensor for measuring a temperature of the heated resist solution in said supply tube; and
    a control unit for controlling a heating temperature of said heating unit based on a measurement result by said temperature sensor.

2. The resist solution supply apparatus as set forth in claim 1, wherein
    the pump is a tubephragm-type pump.

3. The resist solution supply apparatus as set forth in claim 1, further comprising:
    a valve in the supply tube between the pump and the cooling unit for starting and stopping supply of the resist solution downstream from the pump to the cooling unit and the coating nozzle.

4. The resist solution supply apparatus as set forth in claim 3, wherein
    the valve starting and stopping supply of the resist solution is performed by an opening/closing operation.

5. The resist solution supply apparatus as set forth in claim 3, wherein
    the valve is an air-operation valve.

6. A resist solution supply method of supplying a resist solution to a coating nozzle for discharging the resist solution to a substrate, comprising:
    a first storing step of storing, by a resist solution supply source, the resist solution containing a fluorine-based resin;
    a supplying step of supplying, by a supply tube, the resist solution from said resist solution supply source to said coating nozzle;
    a second storing step of storing, by a tank provided between said resist solution supply source and said coating nozzle, the resist solution supplied by the resist solution supply source;
    a removing step for removing, by a filter provided in said supply tube between said tank and said coating nozzle, foreign matter in the resist solution;
    a heating step of heating the resist solution, by a heating unit provided in the supply tube between the filter and the tank, up to a predetermined temperature higher than a room temperature at which a resist gel in said resist solution starts to aggregate;
    a cooling step of cooling, by a cooling unit provided along said supply tube between said filter and said coating nozzle, the resist solution down to the room temperature;
    a trapping step of trapping, by a trap provided in the supply tube between the filter and the cooling unit, foreign matter in the resist solution;
    a pressure-feeding step of pressure-feeding, by a pump provided in the supply tube between the trap and the cooling unit, the resist solution from the resist solution supply source to the coating nozzle;
    a measuring step for measuring, by a temperature sensor, a temperature of the heated resist solution in the supply tube heated in the heating step; and
    a control step for controlling, by a control unit, a heating temperature used in said heating step by said heating unit, based on a measurement result measured by said temperature sensor in said measuring step.

7. A computer-readable storage medium storing instructions, that when executed by a processor of a control unit that controls a resist solution supply apparatus, causes the resist solution supply apparatus to execute a resist solution supply method of supplying a resist solution to a coating nozzle for discharging the resist solution to a substrate, said resist solution supply method, comprising
    a first storing step of storing, by a resist solution supply source, the resist solution containing a fluorine-based resin;
    a supplying step of supplying, by a supply tube, the resist solution from said resist solution supply source to said coating nozzle;
    a second storing step of storing, by a tank provided between said resist solution supply source and said coating nozzle, the resist solution supplied by the resist solution supply source;
    a removing step for removing, by a filter provided in said supply tube between said tank and said coating nozzle, foreign matter in the resist solution;
    a heating step of heating the resist solution, by a heating unit provided in the supply tube between the filter and the tank, up to a predetermined temperature higher than a room temperature at which a resist gel in said resist solution starts to aggregate;

a cooling step of cooling, by a cooling unit provided along said supply tube between said filter and said coating nozzle, the resist solution down to the room temperature;

a trapping step of trapping, by a trap provided in the supply tube between the filter and the cooling unit, foreign matter in the resist solution;

a pressure-feeding step of pressure-feeding, by a pump provided in the supply tube between the trap and the cooling unit, the resist solution from the resist solution supply source to the coating nozzle;

a measuring step for measuring, by a temperature sensor, a temperature of the heated resist solution in the supply tube heated in the heating step, and a control step for controlling, by the control unit, a heating temperature used in said heating step by said heating unit, based on a measurement result measured by said temperature sensor in said measuring step.

* * * * *